(12) United States Patent
Tanaka et al.

(10) Patent No.: US 10,937,651 B2
(45) Date of Patent: Mar. 2, 2021

(54) LASER ANNEALING METHOD

(71) Applicant: SAKAI DISPLAY PRODUCTS CORPORATION, Sakai (JP)

(72) Inventors: Masakazu Tanaka, Sakai (JP); Shinji Koiwa, Sakai (JP); Kouichi Karatani, Sakai (JP); Akihiro Shinozuka, Sakai (JP); Nobutake Nodera, Sakai (JP); Takao Matsumoto, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/503,330

(22) Filed: Jul. 3, 2019

(65) Prior Publication Data

US 2020/0043731 A1 Feb. 6, 2020

(30) Foreign Application Priority Data

Jul. 31, 2018 (JP) .............................. JP2018-143166

(51) Int. Cl.
  *H01L 21/02* (2006.01)
  *B23K 26/354* (2014.01)
  *H01L 21/67* (2006.01)
  *H01L 27/12* (2006.01)

(52) U.S. Cl.
  CPC ...... *H01L 21/02678* (2013.01); *B23K 26/354* (2015.10); *H01L 21/0268* (2013.01); *H01L 21/02691* (2013.01); *H01L 21/67115* (2013.01); *H01L 27/1274* (2013.01)

(58) Field of Classification Search
  CPC .......... H01L 21/02678–0268; H01L 21/02691
  See application file for complete search history.

(56) References Cited

U.S. PATENT DOCUMENTS

| | | | |
|---|---|---|---|
| 6,322,625 B2 | 11/2001 | Im | |
| 2002/0104750 A1* | 8/2002 | Ito | ........................ B23K 26/066 204/157.15 |
| 2005/0081780 A1* | 4/2005 | Park | ........................ C30B 13/24 117/43 |
| 2005/0223970 A1* | 10/2005 | Taniguchi | ............ B23K 26/073 117/200 |

FOREIGN PATENT DOCUMENTS

| | | |
|---|---|---|
| JP | 2000-505241 A | 4/2000 |
| WO | 97/45827 A1 | 12/1997 |

* cited by examiner

*Primary Examiner* — Selim U Ahmed
*Assistant Examiner* — Evan G Clinton
(74) *Attorney, Agent, or Firm* — ScienBiziP, P.C.

(57) ABSTRACT

A laser annealing method includes: step A of providing a substrate having an amorphous semiconductor film formed on a surface thereof; and step B of selectively irradiating a portion of the amorphous semiconductor film with laser light. The step B includes a step of simultaneously forming, in the portion, two molten regions that have elongate shapes congruent to each other and are arranged in line symmetry with each other.

7 Claims, 14 Drawing Sheets

LASER ANNEALING METHOD

BACKGROUND

1. Technical Field

The present invention relates to a laser annealing apparatus, a thin film transistor, a laser annealing method and a mask.

2. Description of the Related Art

While examples of TFTs (Thin Film Transistors) of liquid crystal displays include amorphous silicon (non-crystalline, a-Si) TFTs and low temperature polysilicon (polycrystalline, p-Si) TFTs, for example, polycrystalline silicon has been often used instead of amorphous silicon in cases where there is a demand for high-speed operations such as with driver circuits, etc.

For crystallization of semiconductor film regions on the substrate, a process is known in the art for growing grain boundaries in the lateral direction parallel to the substrate surface by using a sequential lateral solidification (SLS) method. In the conventional SLS method, intended regions of a silicon film are irradiated with laser light through thin slit openings of a mask so as to completely melt the silicon of the regions, and the molten silicon is then re-solidified. When the molten silicon is re-solidified, grain boundaries grow in the direction of the thin width of the thin-slit irradiated regions corresponding to the openings. Then, by repeatedly shifting regions to be irradiated with laser light by shifting the substrate, it is possible to grow grain boundaries in the substrate shift direction (the scanning direction) (Patent Document No. 1: see Japanese National Phase PCT Laid-Open Publication No. 2000-505241).

SUMMARY

However, with the conventional SLS method, the growth direction of grain boundaries is limited to the substrate scanning direction. Therefore, if the laser light intensity varies from one shot to another, the characteristics (e.g., the electron mobility, etc.) of the crystallized semiconductor film (the crystal line semiconductor film) may vary from one irradiation region to another. For example, where grain boundaries are made to grow in the longitudinal direction of the channel region of the thin film transistor, the source-drain current value may vary depending on the current flow direction (the polarity of the source-drain voltage).

The present invention has been made in view of the above, and an object thereof is to provide a laser annealing apparatus capable of preventing the source-drain current value of the thin film transistor from varying depending on the current flow direction, a thin film transistor manufactured by the laser annealing apparatus, a laser annealing method, and a mask that is a part of the laser annealing apparatus.

A laser annealing apparatus according to an embodiment of the present invention is a laser annealing apparatus including a mask having an opening row, wherein the opening row includes openings each including an opening region and arranged in a scanning direction, for irradiating a substrate with laser light through the openings, wherein a first opening including a first opening region and a second opening including a second opening region are arranged next to each other in a direction parallel to the scanning direction, and the mask has a first opening row in which the second opening region includes two opening regions that are obtained by displacing a region corresponding to the first opening region at the second opening in a direction perpendicular to the scanning direction and oppose each other with the region corresponding to the first opening region interposed therebetween.

A thin film transistor according to an embodiment of the present invention has an active layer that is annealed by the laser annealing apparatus according to an embodiment of the present invention.

A mask according to an embodiment of the present invention is a mask having an opening row, wherein the opening row includes openings each including an opening region and arranged in a scanning direction, wherein a first opening including a first opening region and a second opening including a second opening region are arranged next to each other in a direction parallel to the scanning direction, and the mask has a first opening row in which the second opening region includes two opening regions that are obtained by displacing a region corresponding to the first opening region at the second opening in a direction perpendicular to the scanning direction and oppose each other with the region corresponding to the first opening region interposed therebetween.

A laser annealing method according to an embodiment of the present invention includes: step A of providing a substrate having an amorphous semiconductor film formed on a surface thereof; and step B of selectively irradiating a portion of the amorphous semiconductor film with laser light, wherein step B includes a step of simultaneously forming, in said portion, two molten regions that have elongate shapes congruent to each other and are arranged in line symmetry with each other.

According to the present invention, it is possible to prevent the source-drain current value of the thin film transistor from varying depending on the current flow direction.

DETAILED DESCRIPTION

Figure 1:
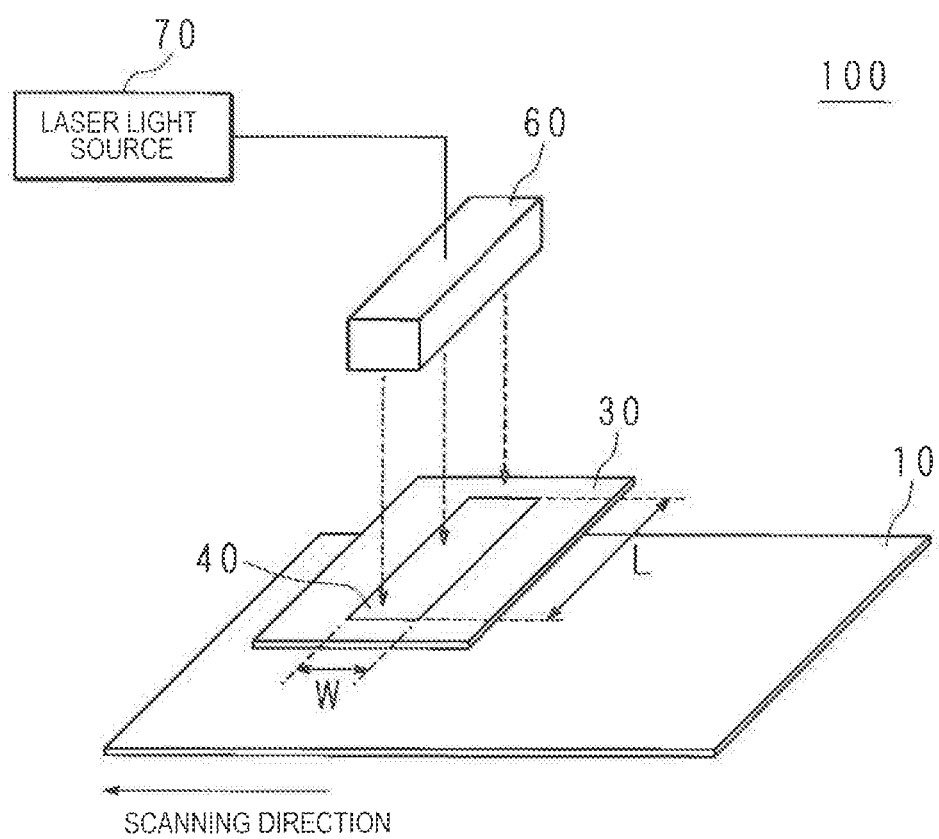
FIG. 1 is a schematic view showing an example configuration of a laser annealing apparatus of the present embodiment.

The present invention will now be described with reference to drawings that show embodiments thereof. FIG. 1 is a schematic view showing an example configuration of a laser annealing apparatus of the present embodiment. A laser annealing apparatus 100 of the present embodiment includes a laser light source 70 that emits laser light, an optical system 60 that includes a group of lenses for shaping the laser light emitted from the laser light source 70 into a parallel beam, a mask (light-blocking plate) 30 that includes a mask portion 40 where openings and microlenses to be described below are arranged in an array, etc. The parallel beam shaped through the optical system 60 selectively irradiates intended locations of a substrate 10 through the openings and the microlenses of the mask portion 40. The substrate 10 is transferred at a constant speed by a driving mechanism (not shown). The laser light source 70 shoots laser light at time intervals such that laser light is shot each time an irradiation position of the substrate 10 arrives at a position corresponding to an opening. Note that the laser annealing apparatus 100 may be configured so that the mask 30, or the like, is moved while the substrate 10 is fixed, instead of moving the substrate 10. An example where the substrate 10 is moved will be described below.

Figure 2:
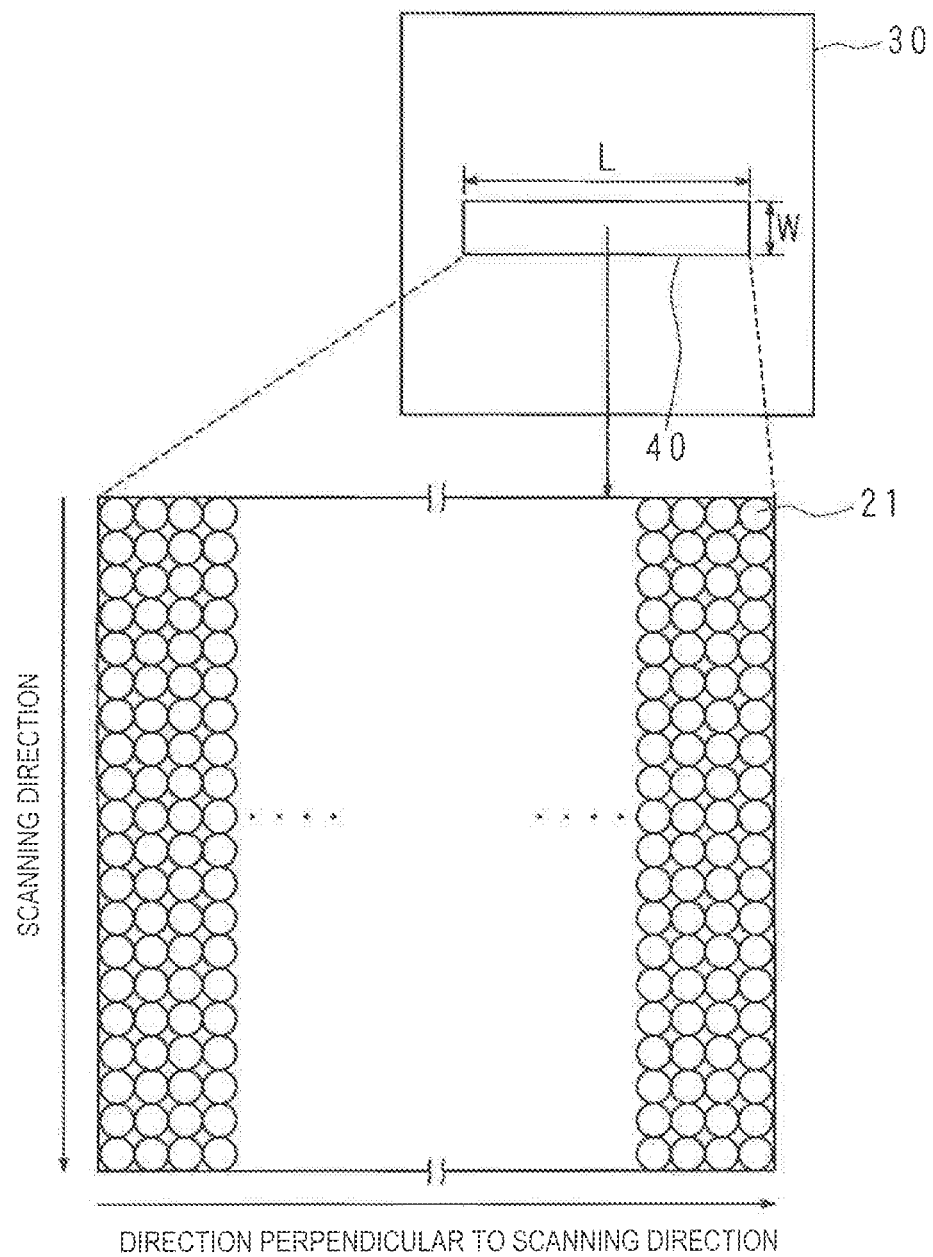
FIG. 2 is a schematic plan view showing an example configuration of a mask of the present embodiment.

FIG. 2 is a schematic plan view showing an example configuration of the mask 30 of the present embodiment. The mask 30 includes the rectangular mask portion 40. The dimension of the mask portion 40 in the scanning direction (vertical direction) is denoted as W, and the dimension thereof in the direction (lateral direction) perpendicular to the scanning direction as L. The mask portion 40 includes an array of microlenses 21 arranged at regular intervals in the scanning direction and in the direction perpendicular to the scanning direction. Openings to be described below are formed at predetermined positions that are the positions of the centers of the microlenses 21 as seen from above.

The vertical dimension W of the mask portion 40 may be about 5 mm and the lateral dimension L may be about 50 nm, for example, but these dimensions are not limited thereto. Twenty microlenses 21 are arranged at regular intervals in the scanning direction (vertical direction). Since each microlens 21 corresponds to one opening, the mask 30 includes 20 openings arranged at regular intervals in the scanning direction (vertical direction). In FIG. 2, each row of 20 openings provided along the scanning direction is referred to as an "opening row". The mask 30 includes a plurality of opening rows arranged in the direction perpendicular to the scanning direction.

Figure 3:
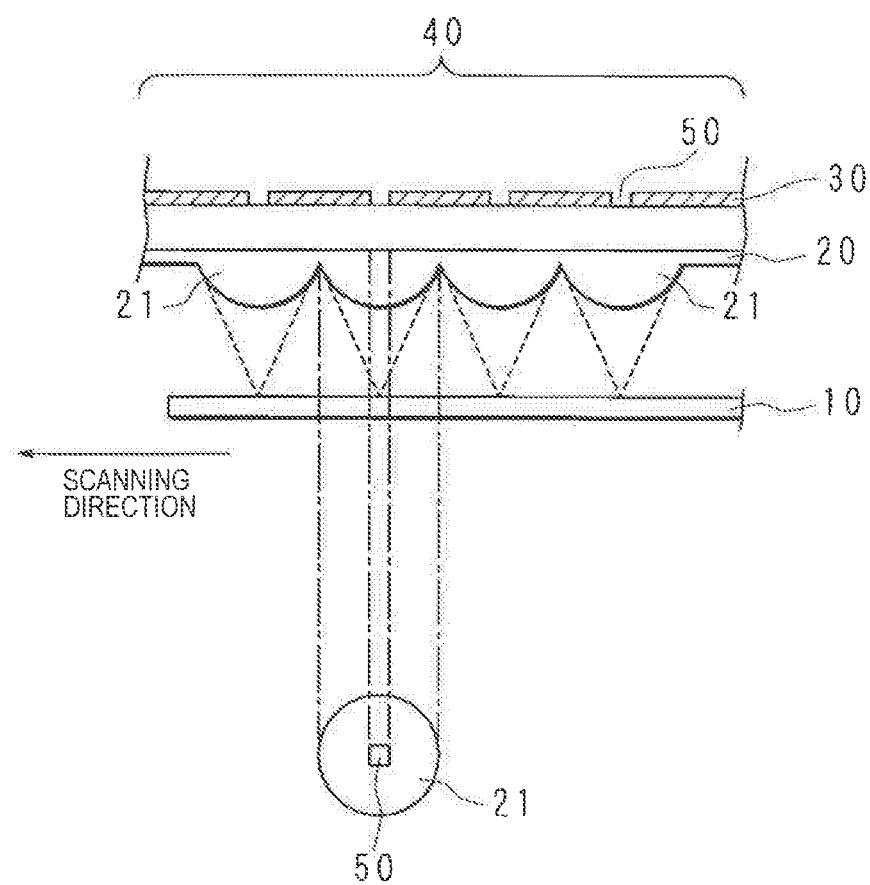
FIG. 3 is a schematic view showing the positional relationship between openings and microlenses of the present embodiment.

FIG. 3 is a schematic view showing the positional relationship between openings 50 and the microlenses 21 of the present embodiment. FIG. 3 shows the positional relationship between the openings 50 and the microlenses 21 as seen from above, and also shows the position of an opening 50 with respect to the position of the corresponding microlens 21 as seen from above. Note that the size of the opening 50 and the size of the irradiation pattern are drawn to be generally equal to each other in the present embodiment for the sake of illustration. In practice, however, laser light is converged through the microlens 21, and the size of the opening 50 is larger than the size of the irradiation pattern. As shown in FIG. 3, the mask portion 40 includes a plurality of openings 50 and a plurality of microlenses (lenses) 21. Note that the microlenses 21 are formed on a transparent substrate 20 corresponding to the openings 50, and the transparent substrate 20 and the mask 30 are integral with each other. The openings 50 are arranged so that the center of each microlens 21 having a circular shape as seen from above coincides with the center of the corresponding opening 50 having a rectangular shape as seen from above. The mask 30 and the light-receiving surface of the microlenses 21 are appropriately spaced apart from each other. The maximum size of the microlenses 21 (the diameter of the circular shape as seen from above) may be set to about 150 µm to about 400 µm, for example, but is not limited thereto. A collection of microlenses 21 will be referred to also as a "microlens array". Note that an opening 50 is herein also referred to simply as an "opening", which includes one or more opening regions.

Figure 6:
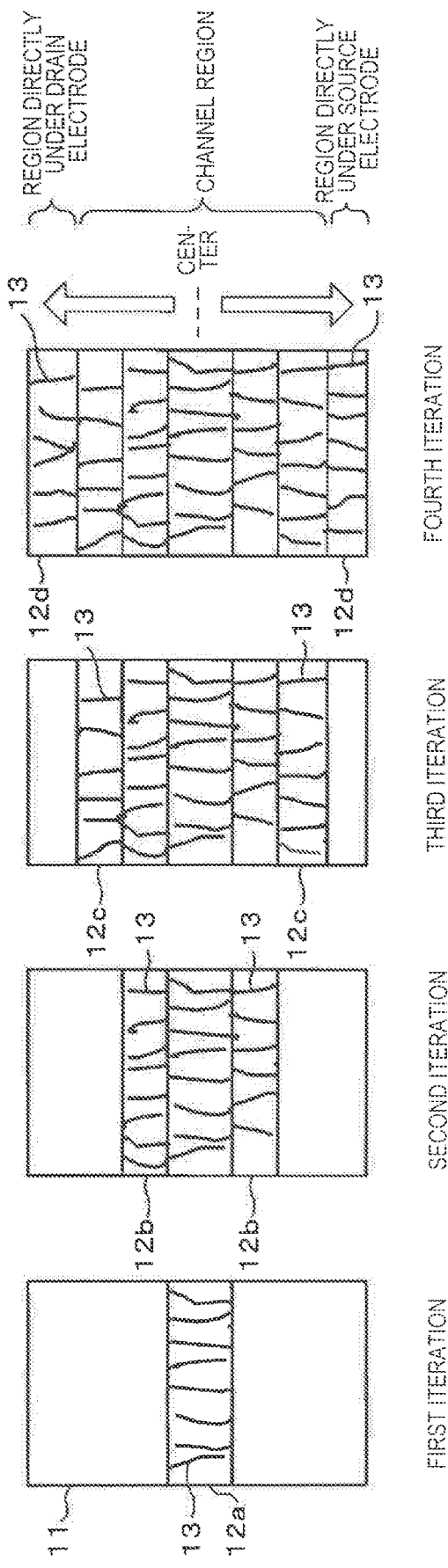
FIG. 6 is a schematic view showing an example of how an amorphous silicon film that is annealed using the mask portion shown in FIG. 5 grows.

When the parallel beam shaped through the optical system 60 described above hits an opening 50 of the mask portion 40, the laser light having passed through the corresponding opening 50 is converged through the microlens 21, and the converged laser light selectively irradiates an intended location on the substrate 10 that corresponds to the opening 50 (i.e., the microlens 21). The intended location is typically a region to be a semiconductor layer (which may be referred to also as an "active layer") of one TFT. As shown in FIG. 6, etc., a semiconductor layer (active layer) of one TFT includes a channel region, a source region and a drain region.

Figure 4A:
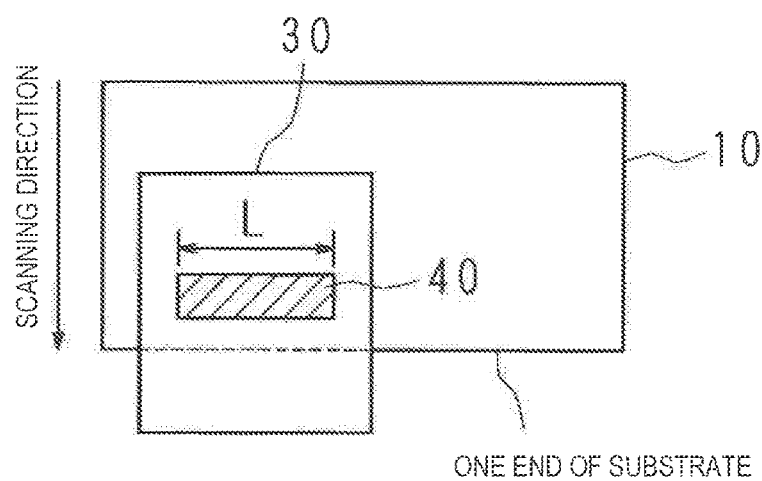
FIG. 4A is a schematic view showing an example of a substrate scanning operation of the laser annealing apparatus of the present embodiment.
Figure 4B:
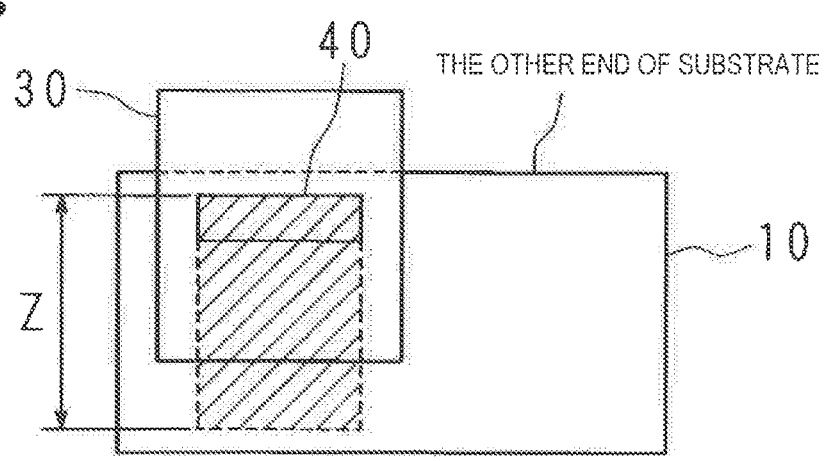
FIG. 4B is a schematic view showing an example of a substrate scanning operation of the laser annealing apparatus of the present embodiment.
Figure 4C:
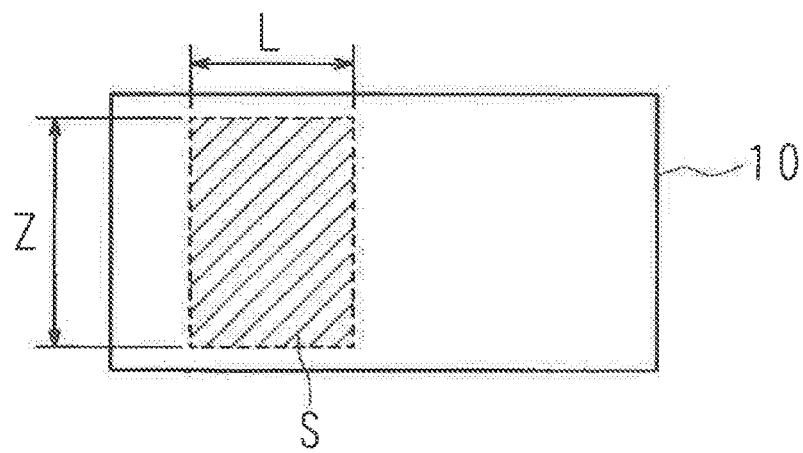
FIG. 4C is a schematic view showing an example of a substrate scanning operation of the laser annealing apparatus of the present embodiment.

FIG. 4A, FIG. 4B and FIG. 4C are schematic views showing an example scan of the substrate 10 by the laser annealing apparatus 100 of the present embodiment. FIG. 4A shows a state where the mask 30 is set at a predetermined position, showing a state before the movement of the substrate 10 in the scanning direction is started. From the state shown in FIG. 4A, the substrate 10 is moved in the scanning direction at a constant speed. The laser light source 70 shoots laser light at time intervals such that laser light is shot each time an irradiation position of the substrate 10 arrives at a position corresponding to an opening 50. For example, with the openings 50 illustrated in FIG. 2, the same location of the substrate 10 is irradiated with laser light 20 times. FIG. 4B shows a state where the substrate 10 has been moved at a constant speed to the final position in the scanning direction (i.e., over the distance Z). By moving the substrate 10 to the state shown in FIG. 4B, the intended locations within an irradiation region S on the substrate 10 can be selectively irradiated with laser light as shown in FIG. 4C. In the state shown in FIG. 4C, by moving the mask 30 over the distance L in the direction perpendicular to the scanning direction, and moving the substrate 10 in the scanning direction as shown in FIG. 4A and FIG. 4b, it is possible to increase the irradiation region S. Note that while the size of the substrate 10 and the size of the mask 30 are shown to be similar to each other in FIG. 4, the size of the substrate 10 is in practice far larger than that shown in FIG. 4.

Figure 5:
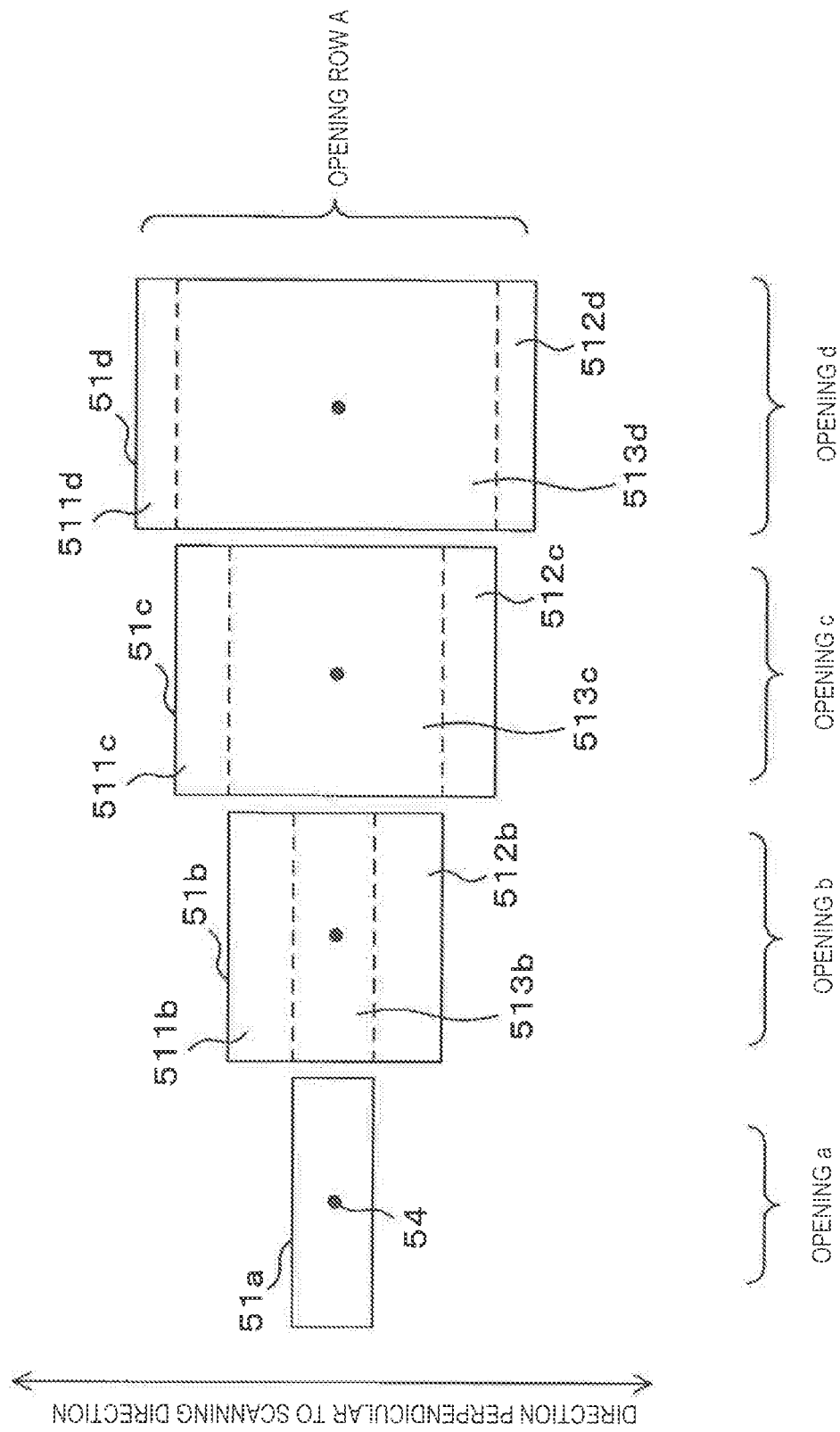
FIG. 5 is a schematic view showing a first example of openings of a mask portion of the present embodiment.

Next, the mask portion 40 of the mask 30 of the present embodiment will be described in detail. FIG. 5 is a schematic view showing a first example of openings of the mask portion 40 of the present embodiment. As shown in FIG. 5, the opening row A corresponds to the first opening row, and four different openings a, b, c and d are provided along the direction parallel to the scanning direction. While four different openings a, b, c and d are shown to be adjacent to each other in the scanning direction in FIG. 5, this does not represent the positions of the openings in the scanning direction.

Each of the openings a, b, c and d is provided in the vicinity of a central position 54 of the corresponding one of the microlenses 21. Where the diameter of the microlens 21 is 250 μm, for example, each of the openings a, b, c and d is formed within a radius of 10 μm to 20 μm from the central position 54 of the corresponding microlenses 21. The range over which the openings a, b, c and d are formed can be set appropriately so that the microlenses 21 can project, in reduced projection, with a sufficient precision the images of the openings a, b, c and d onto the surface of the semiconductor film. The number of times the semiconductor film is irradiated with laser light to melt the semiconductor film depends on the laser light irradiation energy density.

For example, the microlens array shown in FIG. 2 includes 20 (20 rows) of microlens 21 arranged in the scanning direction. The four different openings a, b, c and d are arranged corresponding to the 20 microlenses 21. For example, the opening a is arranged corresponding to microlenses 21 of the first row (the bottom row in FIG. 2) to the fifth row in the scanning direction, the opening b is arranged corresponding to microlenses 21 of the sixth row to the tenth row, the opening c is arranged corresponding to microlenses 21 of the eleventh row to the fifteenth row, and the opening d is arranged corresponding to microlenses 21 of the sixteenth row to the twentieth row.

Using the mask 30 including the four different openings a, b, c and d arranged as described above, regions of the semiconductor film to be the active layers of the TFTs are irradiated with laser light 20 times while moving the microlens array including 20 rows of microlenses 21 row by row relative to the substrate 10. Then, the region corresponding to the opening a is irradiated with laser light for the first to fifth shots, the region corresponding to the opening b is irradiated with laser light for the sixth to tenth shots, the region corresponding to the opening c is irradiated with laser light for the eleventh to fifteenth shots, and the region corresponding to the opening d is irradiated with laser light for the sixteenth to twelfth shots. That is, this example is a case where the amorphous semiconductor film is melted by being irradiated with laser light five times.

The number of rows of the microlens array does not need to be 20 rows, but it may be four rows or more than 20 rows. It may be changed as necessary taking into consideration the laser light irradiation energy density, the oscillation time, the light-converging ability of microlenses and the reduction rate that is determined based on the distance between the microlenses and the semiconductor film, etc.

Note that the region that is crystallized by laser light irradiation (the polycrystalline region) is not melted unless it is heated to its melting point or higher. The temperature for melt-crystallizing the amorphous semiconductor film is lower than the melting point of the polycrystalline, and the laser light irradiation energy density, the irradiation time and the number of times of irradiation for melt-crystallizing an amorphous semi conductor film are set so that the semiconductor film is not heated to or above the melting point of the polycrystalline.

Where the opening a is regarded as the first opening, the opening b can be regarded as the second opening. Similarly, where the opening b is regarded as the first opening, the opening c can be regarded as the second opening. The relationship between the opening c and the opening d is also similar to the relationship between the opening a and the opening b. In FIG. 5, the reference sign 54 denotes the central, position of the microlenses 21 (not shown) and also denotes the central position of the openings a to d. The interval between the central positions 54 that are arranged next to each other in the direction parallel to the scanning direction is the distance over which the substrate 10 is moved between laser light shots.

As shown in FIG. 5, in the opening row A, the opening a includes an opening region 51a, the opening b includes an opening region 51b, the opening c includes an opening region 51c, and the opening d includes an opening region 51d. Each of the opening regions 51a to 51d forms a rectangular shape. Note that the shapes of the opening regions of FIG. 5 are shown for the sake of illustration, and the actual opening regions may have shapes different from those shown in FIG. 5.

The opening region 51a is arranged so as to correspond to the center of the region to be crystallized (herein, the region to be the active layer), and has a rectangular shape elongated in the scanning direction. The width (the dimension in the direction perpendicular to the scanning direction) of the opening region 51a is some μm, for example. An elongated rectangular shape as used herein refers to a shape whose aspect ratio (long side/short side) is three or more, and the length of the short side is 4 μm or less, for example. If the length of the short side exceeds 4 μm, the lateral growth may not reach the center of the molten region during crystallization, resulting in microcrystals occurring in the middle of the molten region. Note that the shape of each opening region is not limited to a rectangular shape, but may be an elliptical shape, for example, in which case the aspect ratio can be defined as major axis/minor axis. An opening region may have a shape other than a rectangular shape or an elliptical shape, in which case the shape is preferably line-symmetrical with respect to the major axis and the minor axis.

In the opening row A, where the opening a is regarded as the first opening and the opening b as the second opening, the opening region 51a (the first opening region) and the opening region 51b (the second opening region) are arranged next to each other in the direction parallel to the scanning direction. When opening regions are shifted so that the central position 54 of the opening a coincides with the central position 54 of the opening b, the opening region 51b is one opening region that includes the opening region 51a, and two opening regions 511b and 512b that oppose each other with a region 513b corresponding to the opening region 51a interposed therebetween, wherein the two opening regions 511b and 512b are displaced, in the direction perpendicular to the scanning direction, from the region 513b corresponding to the opening region 51a at the opening b (the second opening). That is, while the opening region 51b is actually one opening region, it may be regarded as being a combination of three opening regions including the region 513b corresponding to the opening region 51a and the two opening regions 511b and 512b that oppose each other with the region 513b corresponding to the opening region 51a interposed therebetween. The opening regions 511b and 512b also have an elongate rectangular shape.

Thus, when laser light is shot through the opening region 51b of the opening b, the region irradiated with laser light through the opening region 51a of the opening a is irradiated again with laser light. In this process, if the region crystallized through the previous laser light irradiation (the polycrystalline semiconductor region) is irradiated with laser light under conditions (the laser light irradiation energy density, the irradiation time and the number of times of irradiation) such that polycrystalline does not melt even when irradiated again with laser light, it is possible to melt only the region irradiated with laser light through the opening regions 511b and 512b. Typical laser light irradiation conditions for crystallizing amorphous silicon satisfy those conditions described above. This similarly applies to opening regions 511c, 512c, 511d and 512d.

Thus, even if the region to be irradiated with laser light in the second or subsequent iteration includes a region that has been previously irradiated with laser light and crystallized, the previously crystallized region is not melted. Therefore, if an amorphous region, of the region to be irradiated with laser light in the second or subsequent iteration, has an elongate shape, it is possible to form a polycrystalline semiconductor region having grain boundaries extending in a predetermined direction. Therefore, although the opening regions 51b, 51c and 51d of FIG. 5 do not have a shape elongated in the lateral direction as does the opening region 51a, it is possible to melt-crystallize regions corresponding to a pair of opening regions 511b and 512b, a pair of opening regions 511S and 512c and a pair of opening regions 511d and 512d. Each of the pair of opening regions 511b and 512b, the pair of opening regions 511c and 512c and the pair of opening regions 511d and 512d has elongate rectangular shapes that are congruent to each other and arranged in line symmetry with each other (the axis of symmetry is parallel to the scanning direction) with respect to the regions 513b, 513c and 513d, which are obtained by shifting the opening region 51a in the scanning direction.

Although four openings a, b, c and d are arranged adjacent to each other in the scanning direction in the description above, five of each of the openings a, b, c and d may be arranged in the scanning direction as described above with reference to FIG. 21. Even in such a case, there are a location where the opening a and the opening b are adjacent to each other, a location where the opening b and the opening c are adjacent to each other, and a location where the opening c and the opening d are adjacent to each other, as described above.

Thus, according to an embodiment of the present invention, the mask includes a pair of opening regions that have elongate shapes congruent to each other and are arranged in line symmetry with each other with respect to a region to be crystallized (e.g., an active region). Therefore, regions of a semiconductor film corresponding to the opening regions are selectively irradiated with laser light and melted. That is, the regions of the semiconductor film corresponding to the opening regions (i.e., the regions onto which the opening regions are projected in reduced projection) are melted. The regions of the semiconductor film corresponding to the opening regions that are irradiated with laser light and melted may be referred to as the "molten regions". The shape of a molten region is similar to the shape of the corresponding opening region. By the irradiation with laser light through a pair of opening regions that have elongate shapes congruent to each other and are arranged in line symmetry with each other, there are formed two molten regions that have elongate shapes congruent to each other and are arranged in line symmetry with each other. As a result, for example, it is possible to form an active layer having a crystalline structure that is line-symmetrical (including the size of grain boundaries and the direction in which grain boundaries grow) with respect to the center of the active layer.

Next, grain boundaries will be described. When an amorphous silicon (non-crystalline, a-Si) film is irradiated with laser light, the amorphous silicon film is hot-melted. The crystal growth advances with the hot-melted amorphous silicon solidifying inwardly from the laser light irradiation region boundary. The crystallized region of the semiconductor film has a structure (polycrystalline structure) that is a collection of many regions (referred to also as the "crystal grains") where atoms are arranged in different directions, and boundaries between crystal grains are referred to as grain boundaries. Where the laser light irradiation region is an elongate rectangular shape, crystals that grow from the opposing boundaries along the width direction inwardly come close to each other, resulting in the direction of grain boundaries being generally the width direction. Note that since the directions of individual grain boundaries vary, the direction of a grain boundary as used herein means the average direction among the grain boundaries included in the crystallized region, referring to the general direction of the crystal grains as a whole.

FIG. 6 is a schematic view showing an example of how an amorphous silicon film that is annealed using the mask portion 40 shown in FIG. 5 grows. The crystallization through laser light irradiation described above is referred to as an annealing process.

FIG. 6 shows the channel region, the region (the source region) directly under the source electrode and the region (the drain region) directly under the drain electrode, which are on the opposite sides of the channel region. The reference sign 11 denotes an amorphous silicon film, and the reference signs 12a to 12d denote polysilicon films. The reference sign 13 denotes grain boundaries. FIG. 6 schematically shows how crystals grow in the amorphous silicon film, which is the laser light irradiation region, showing, left to right, how crystals grow over the number of times of laser light irradiation (from the first iteration to the fourth iteration). Note that the first iteration is when laser light is shot through the opening a, the second iteration is when laser light is shot through the opening b, the third iteration is when laser light is shot through the opening c, and the fourth iteration is when laser light is shot through the opening d. Where laser light is shot five times, for example, through each of the openings a, b, c and d, the figure schematically shows grain boundaries after the fifth shot.

The first iteration in FIG. 6 shows the crystal growth in the irradiation region when laser light is shot through the opening a shown in FIG. 5. The opening region 51a has a rectangular shape elongated in the direction parallel to the scanning direction (referred to also as the "lateral direction"), and the width dimension thereof along the direction perpendicular to the scanning direction (which is referred to also as the vertical direction) is small. Therefore, the hot-melted amorphous silicon film 11 solidifies inwardly from the opposing boundaries in the lateral direction of the irradiation region corresponding to the opening region 51a, forming the polysilicon film 12a. In this case, the direction of grain boundaries 13 is the vertical direction.

The second iteration shows the crystal growth in the irradiation region when laser light is shot through the opening b shown in FIG. 5. The opening region 51b includes the two opening regions 511b and 512b that are obtained by displacing the region 513b corresponding to the opening region 51a in the direction perpendicular to the scanning direction and oppose each other with the region 513b corresponding to the opening region 51a interposed therebetween. Each of the two opening regions 511b and 512b has a rectangular shape elongated in the lateral direction, and the width dimension thereof along the vertical direction is small. Therefore, the hot-melted amorphous silicon film 11 solidifies inwardly from the opposing boundaries in the lateral direction of the irradiation region corresponding to the opening region 51b, forming a polysilicon film 12b. Also in this case, the direction of grain boundaries 13 is the vertical direction.

The third iteration shows the crystal growth in the irradiation region when laser light is shot through the opening c shown in FIG. 5. The opening region 51c includes the two opening regions 511c and 512c that are obtained by displacing the region 513c corresponding to the opening region 51b in the direction perpendicular to the scanning direction and oppose each other with the region 513c corresponding to the opening region 51b interposed therebetween. Each of the two opening regions 511c and 512c has a rectangular shape elongated in the lateral direction, and the width dimension thereof along the vertical direction is small. Therefore, the hot-melted amorphous silicon film 11 solidifies inwardly from the opposing boundaries in the lateral direction of the irradiation region corresponding to the opening region 51c, forming a polysilicon film 12c. Also in this case, the direction of grain boundaries 13 is the vertical direction.

Similarly, the fourth iteration shows the crystal growth in the irradiation region when laser light is shot through the opening d shown in FIG. 5. The opening region 51d includes the two opening regions 511d and 512d that are obtained by displacing the region 513d corresponding to the opening region 51c in the direction perpendicular to the scanning direction and oppose each other with the region 513d corresponding to the opening region 51c interposed therebetween. Each of the two opening regions 511d and 512d has a rectangular shape elongated in the lateral direction, and the width dimension thereof along the vertical direction is small. Therefore, the hot-melted amorphous silicon film 11 solidifies inwardly from the opposing boundaries in the lateral direction of the irradiation region corresponding to the opening region 51d, forming a polysilicon film 12d. Also in this case, the direction of grain boundaries 13 is the vertical direction.

Assume that a semiconductor film is irradiated with laser light through the opening region 51a, and grain boundaries grow in the direction perpendicular to the scanning direction in the region irradiated with laser light. At the point in time for the next laser light irradiation, laser light is shot through the opening region 51b. In this case, the opening region 51b includes the two opening regions 511b and 512b that are obtained by displacing the region 513b corresponding to the opening region 51a in the direction perpendicular to the scanning direction and oppose each other with the region 513b corresponding to the opening region 51a interposed therebetween. Since laser light is shot simultaneously through the two opening regions 511b and 512b, the amount of laser light irradiation is not varied (even if varied, the variation will be within the tolerable range) between the irradiation regions corresponding to the two opening regions 511b and 512b.

Therefore, in the irradiation regions of the semiconductor film corresponding to the two opening regions 511b and 512b, grain boundaries grow in the direction perpendicular to the scanning direction. Where the direction parallel to the scanning direction is denoted as the left-right direction and the direction perpendicular to the scanning direction as the up-down direction, grain boundaries grow in the up-down direction away from the central position (e.g., the position indicated by the reference sign 54).

Thus, it is possible to grow grain boundaries in up-down symmetry with respect to an intended central region (e.g., a region corresponding to the central position of the channel region in the longitudinal direction), and the characteristics (e.g., the electron mobility) of the crystallized semiconductor film (the crystalline semiconductor film) can be uniform in the up-down direction with respect to the central region. Therefore, it is possible to prevent the source-drain current value from varying depending on the current flow direction.

In the channel region, since the direction of grain boundaries is the longitudinal direction of the channel region, the degree by which electrons are scattered by grain boundaries is small, and it is possible to realize a large ON current of the thin film transistor.

Figure 7:
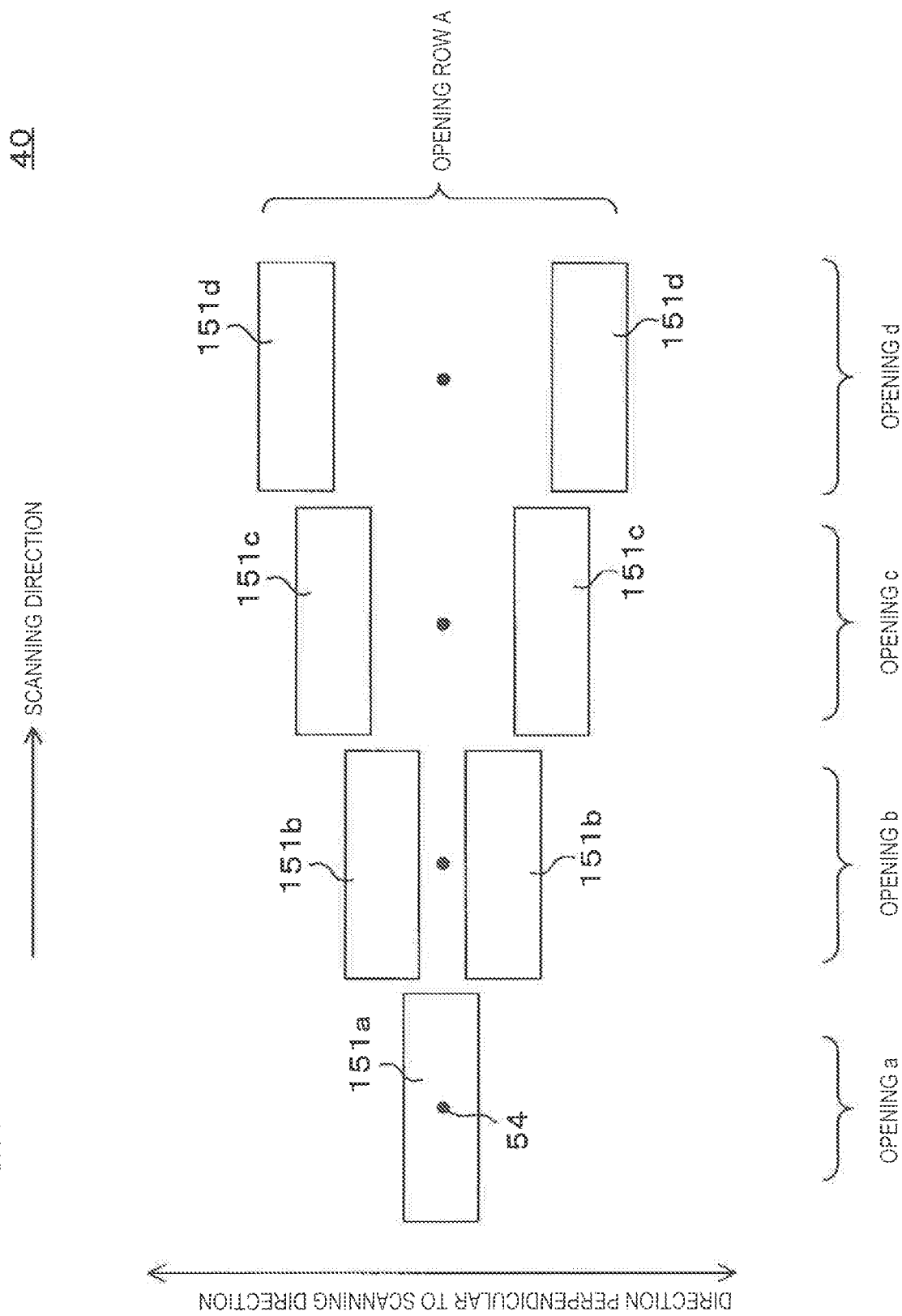
FIG. 7 is a schematic view showing a second example of openings of a mask portion of the present embodiment.

FIG. 7 is a schematic view showing a second example of openings of the mask portion 40 of the present embodiment. In the second example, as shown in FIG. 7, in the opening row A, the opening region 151b does not include a portion of the region corresponding to the opening region 151a at the opening b. That is, the opening region 151b is divided into two opening regions with a portion of the region corresponding to the opening region 151a interposed therebetween. Each of opening regions 151c and 151d is also divided into two opening regions.

Thus, when laser light is shot through the opening region 151b of the opening b, it is possible not to irradiate with laser light the crystalline semiconductor film corresponding to the region between the two opening regions 151b. In this case, by performing the next laser light irradiation so as to partially overlap with the region crystallized through the previous laser light irradiation, crystals that have been produced through the previous laser light irradiation can grow continuously. This similarly applies to the opening regions 151c and 151d.

Note that the crystal growth of the amorphous silicon film annealed using the mask portion 40 shown in FIG. 7 is similar to that shown in FIG. 6.

Figure 8:
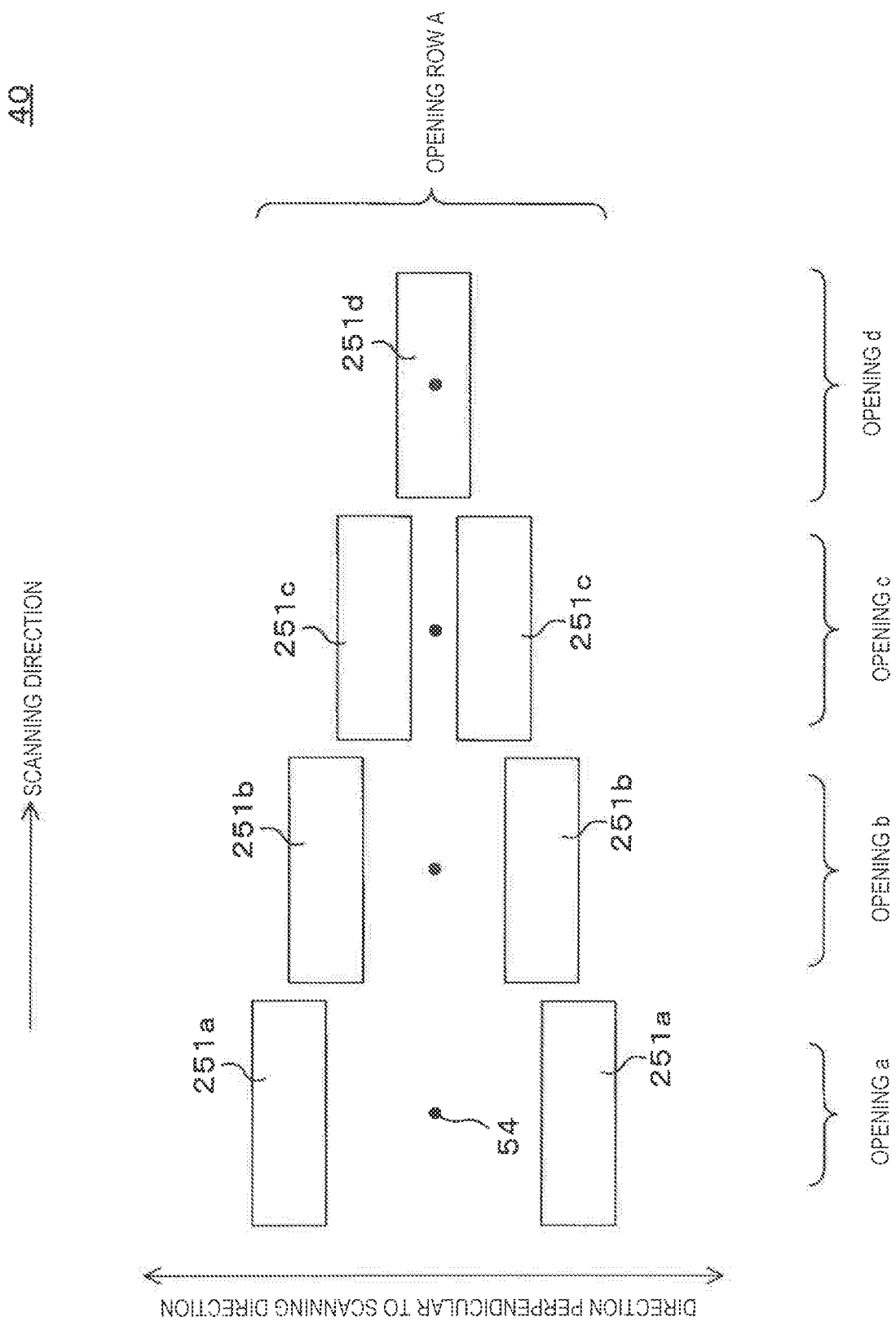
FIG. 8 is a schematic view showing a third example of openings of a mask portion of the present embodiment.

FIG. 8 is a schematic view showing a third example of openings of the mask portion 40 of the present embodiment. In the second example described above, as shown in FIG. 7, the opening regions of the openings are gradually, in the scanning direction, further away from the central position in the direction perpendicular to the scanning direction. In the third example, as shown in FIG. 8, the opening regions of the openings are gradually, in the scanning direction, closer to the central position in the direction perpendicular to the scanning direction.

In FIG. 8, where the opening d is regarded as the first opening, the opening c can be regarded as the second opening. Similarly, where the opening c is regarded as the first opening, the opening b can be regarded as the second opening. The relationship between the opening b and the opening a is also similar to the relationship between the opening c and the opening b.

In the opening row A, the opening d includes the opening region 251d, the opening c includes the opening region 251c, the opening b includes the opening region 251b, and the opening a includes the opening region 251a. Each of the opening regions 251a to 251d forms a rectangular shape.

In the third example of FIG. 8, as opposed to the second example of FIG. 7, as the opening regions of the openings are viewed in the direction opposite to the scanning direction, the opening region 251c in the opening c includes two opening regions that are obtained by displacing a region corresponding to the opening region 251d at the opening c in the direction perpendicular to the scanning direction and oppose each other with the region corresponding to the opening region 251d interposed therebetween. The opening region 251b in the opening b includes two opening regions that are obtained by displacing a region corresponding to the opening region 251c at the opening b in the direction perpendicular to the scanning direction and oppose each other with the region corresponding to the opening region 251c interposed therebetween. The opening region 251a in the opening a includes two opening regions that are obtained by displacing a region corresponding to the opening region 251b at the opening a in the direction perpendicular to the scanning direction and oppose each other with the region corresponding to the opening region 251b interposed therebetween.

Figure 9:
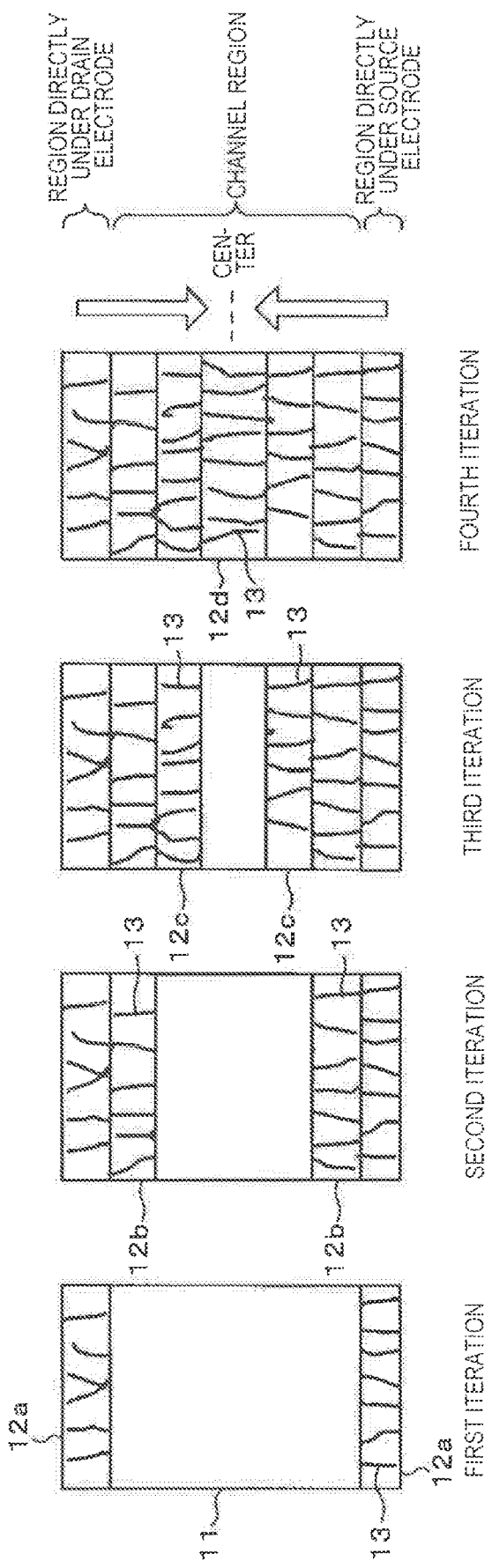
FIG. 9 is a schematic view showing an example of how an amorphous silicon film that is annealed using the mask portion shown in FIG. 8 grows.

FIG. 9 is a schematic view showing an example of how an amorphous silicon film that is annealed using the mask portion 40 shown in FIG. 8 grows. FIG. 9 shows the channel region, the region directly under the source electrode and the region directly under the drain electrode, which are on the opposite sides of the channel region. The reference sign 11 denotes an amorphous silicon film, and the reference signs 12a to 12d denote polysilicon films. The reference sign 13 denotes grain boundaries. FIG. 9 schematically shows how crystals grow in the amorphous silicon film, which is the laser light irradiation region, showing, left to right, how crystals grow over the number of times of laser light irradiation (from the first iteration to the fourth iteration). Again, the first iteration is when laser light is shot through the opening a, the second iteration is when laser light is shot through the opening b, the third iteration is when laser light is shot through the opening c, and the fourth iteration is when laser light is shot through the opening d. Where laser light is shot five times, for example, through each of the openings a, b, c and d, the figure schematically shows grain boundaries after the fifth shot.

The first iteration in FIG. 9 shows the crystal growth in the irradiation region when laser light is shot through the opening a shown in FIG. 8. The opening region 251a has a rectangular shape elongated in the direction parallel to the scanning direction (referred to also as the "lateral direction"), and the width dimension thereof along the direction perpendicular to the scanning direction (which is referred to also as the vertical direction) is small. Therefore, the hot-melted amorphous silicon film 11 solidifies inwardly from the opposing boundaries in the lateral direction of the irradiation regions that correspond respectively to the two opening regions 251a, forming the polysilicon film 12a. In this case, the direction of grain boundaries 13 is the vertical direction.

The second iteration shows the crystal growth in the irradiation region when laser light is shot through the opening b shown in FIG. 8. Each of the two opening regions 251b and 251b has a rectangular shape elongated in the lateral direction, and the width dimension thereof along the vertical direction is small. Therefore, the hot-melted amorphous silicon film 11 solidifies inwardly from the opposing boundaries in the lateral direction of the irradiation region corresponding to the opening region 251b, forming the polysilicon film 12b. Also in this case, the direction of grain boundaries 13 is the vertical direction.

The third iteration shows the crystal growth in the irradiation region when laser light is shot through the opening c shown in FIG. 8. Each of the two opening regions 251c and 251c has a rectangular shape elongated in the lateral direction, and the width dimension thereof along the vertical direction is small. Therefore, the hot-melted amorphous silicon film 11 solidifies inwardly from the opposing boundaries in the lateral direction of the irradiation region corresponding to the opening region 251c, forming the polysilicon film 12c. Also in this case, the direction of grain boundaries 13 is the vertical direction.

Similarly, the fourth iteration shows the crystal growth in the irradiation region when laser light is shot through the opening d shown in FIG. 8. The opening region 251d has a rectangular shape elongated in the lateral direction, and the width dimension thereof along the vertical direction is small. Therefore, the hot-melted amorphous silicon film 11 solidifies inwardly from the opposing boundaries in the lateral direction of the irradiation region corresponding to the opening region 251d, forming the polysilicon film 12d. Also in this case, the direction of grain boundaries 13 is the vertical direction.

As described above, in the first iteration, since laser light is simultaneously shot through the two opening regions 251a and 251a, the amount of laser light irradiation is not varied (even if varied, the variation will be within the tolerable range) between the irradiation regions corresponding to the two opening regions 251a and 251a. This similarly applies to the opening regions 251b and 251c.

Therefore, for example, in the second iteration, in the irradiation regions of the semiconductor film corresponding to the two opening regions 251b and 251b, grain boundaries grow in the direction perpendicular to the scanning direction. Where the direction parallel to the scanning direction is denoted as the left-right direction and the direction perpendicular to the scanning direction as the up-down direction, grain boundaries grow in the up-down direction toward the central position (e.g., the position indicated by the reference sign 54).

Thus, it is possible to grow grain boundaries in up-down symmetry with respect to an intended central region (e.g., a region corresponding to the central position of the channel region in the longitudinal direction), and the characteristics (e.g., the electron mobility) of the crystallized semiconductor film (the crystalline semiconductor film) can be uniform in the up-down direction with respect to the central region. Therefore, it is possible to prevent the source-drain current value from varying depending on the current flow direction.

Figure 10:
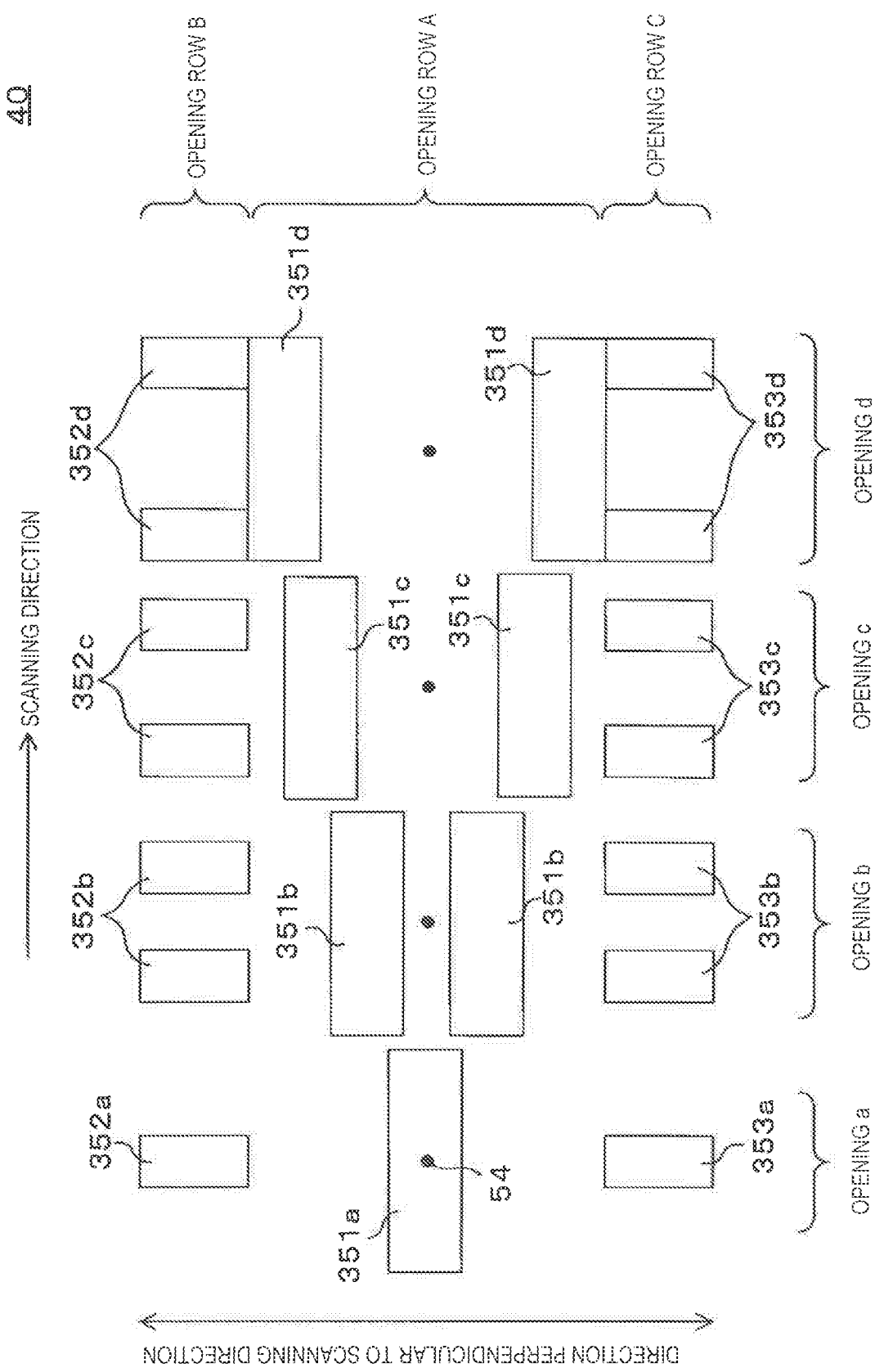
FIG. 10 is a schematic view showing a fourth example of openings of a mask portion of the present embodiment.

FIG. 10 is a schematic view showing a fourth example of openings of the mask portion 40 of the present embodiment. As shown in FIG. 10, each of the opening rows A, B and C includes the openings a, b, c and d arranged in the scanning direction. The opening row A corresponds to the first opening row and the opening rows B and C corresponds to the second opening row. Where the opening a is regarded as the first opening, the opening b can be regarded as the second opening. The relationship between the opening b and the opening c and the relationship between the opening c and the opening d are also similar to the relationship between the opening a and the opening b. In FIG. 10, the reference sign 54 denotes the central position of the microlenses 21 (not shown) and also denotes the central position of the openings a to d.

As shown FIG. 10, in the opening row A, the opening a includes an opening region 351a, the opening b includes an opening region 351b, the opening c includes an opening region 351c, and the opening d includes an opening region 351d. In the opening row B, the opening a includes an opening region 352a, the opening b includes an opening region 352*b*, the opening c includes an opening region 352*c*, and the opening d includes an opening region 352*d*. Similarly, in the opening row C, the opening a includes an opening region 353*a*, the opening b includes an opening region 353*b*, the opening c includes an opening region 353*c*, and the opening d includes an opening region 353*d*. The openings b to d each include two opening regions. In each row, the opening a includes only one opening region, and the openings b to d each include only two opening regions. In each row, the two opening regions of each of the openings b to d are arranged in line symmetry with each other with respect to the center of the opening region of the opening a.

Each of the opening regions of the opening row B and the opening row C has a rectangular shape. More specifically, the opening regions 352*a* to 352*d* and 353*a* to 353*d* each have a shape elongated in the direction perpendicular to the scanning direction. Each of the opening regions of the opening row A also has a rectangular shape. More specifically, the opening regions 351*a* to 351*d* each have a shape elongated in the scanning direction. Note that the shapes of the opening regions shown in FIG. 10 are shown for the sake of illustration, and the actual opening regions may have shapes different from those shown in FIG. 10. The width (the dimension in the scanning direction) of the opening regions 352*a* to 352*d* and 353*a* to 353*d* may be some µm, for example. The width (the dimension in the direction perpendicular to the scanning direction) of the opening regions 351*a* to 351*d* may be some µm, for example.

In the opening row B, the opening a is regarded as the first opening and the opening b as the second opening. When opening regions are shifted so that the central position 54 of the opening a coincides with the central position 54 of the opening b, the opening region 352*b* includes two opening regions that are obtained by displacing a region corresponding to the opening region 352*a* at the opening b in the direction parallel to the scanning direction and oppose each other with the region corresponding to the opening region 352*a* interposed therebetween.

Similarly, in the opening row B, the opening b is regarded as the first opening and the opening c as the second opening. When opening regions are shifted so that the central position 54 of the opening b coincides with the central position 54 of the opening c, the opening region 352*c* includes two opening regions that are obtained by displacing a region corresponding to the opening region 352*b* at the opening c in the direction parallel to the scanning direction and oppose each other with the region corresponding to the opening region 352*b* interposed therebetween. The relationship between the opening c and the opening d is similar to this. The opening row C is similar to the opening row B. Note that the opening row A is similar in structure to the opening row A of FIG. 7, and will not therefore be further described below.

Figure 11:
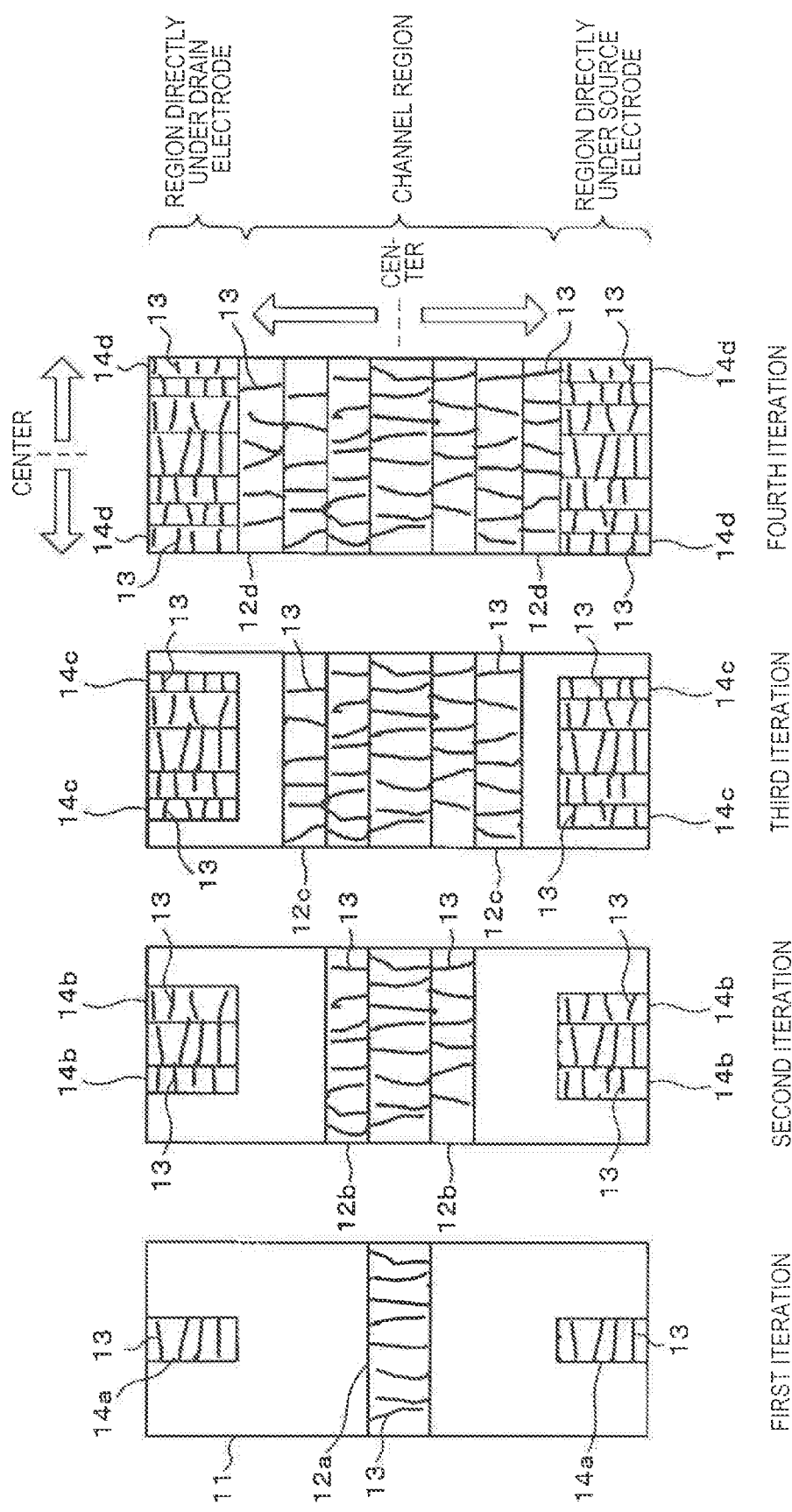
FIG. 11 is a schematic view showing an example of how an amorphous silicon film that is annealed using the mask portion shown in FIG. 10 grows.

FIG. 11 is a schematic view showing an example of how an amorphous silicon film that is annealed using the mask portion 40 shown in FIG. 10 grows. The first iteration in FIG. 11 shows the crystal growth in the irradiation region when laser light is shot through the opening a shown in FIG. 10. The opening region 351*a* has a rectangular shape elongated in the direction parallel to the scanning direction (referred to also as the "lateral direction"), and the width dimension thereof along the direction perpendicular to the scanning direction (which is referred to also as the vertical direction) is small. Therefore, the hot-melted amorphous silicon film 11 solidifies inwardly from the opposing boundaries in the lateral direction of the irradiation region corresponding to the opening region 351*a*, forming the polysilicon film 12*a*. In this case, the direction of grain boundaries 13 is the vertical direction.

The opening region 352*a* has a rectangular shape elongated in the vertical direction and the width dimension thereof along the lateral direction is small. Therefore, the hot-melted amorphous silicon film 11 solidifies inwardly from the opposing boundaries in the vertical direction of the irradiation region corresponding to the opening region 352*a*, forming the polysilicon film 14*a*. In this case, the direction of grain boundaries 13 is the lateral direction. With the opening region 353*a*, similar to the opening region 352*a*, the film solidifies inwardly from the opposing boundaries in the vertical direction of the irradiation region corresponding to the opening region 353*a*, forming the polysilicon film 14*a*. In this case, the direction of grain boundaries 13 is the lateral direction.

The first iteration shows the crystal growth in the irradiation region when laser light is shot through the opening b shown in FIG. 10. The opening region 351*b* includes two opening regions spaced apart from each other in the vertical direction with a region corresponding to the opening region 351*a* interposed therebetween, and the opening region 351*b* forms a rectangular shape elongated in the lateral direction and the width dimension thereof along the vertical direction is small. Therefore, the hot-melted amorphous silicon film 11 solidifies inwardly from the opposing boundaries in the lateral direction of the irradiation region corresponding to the opening region 351*b*, forming the polysilicon film 12*b*. In this case, the direction of grain boundaries 13 is the vertical direction.

The opening region 352*b* includes two opening regions spaced apart from each other in the lateral direction with a region corresponding to the opening region 352*a* interposed therebetween, and the opening region 352*b* forms a rectangular shape elongated in the vertical direction and the width dimension thereof along the lateral direction is small. Therefore, the hot-melted amorphous silicon film 11 solidifies inwardly from the opposing boundaries in the vertical direction of the irradiation region corresponding to the opening region 352*b*, forming the polysilicon film 14*b*. In this case, the direction of grain boundaries 13 is the lateral direction. With the opening region 353*b*, similar to the opening region 352*b*, the film solidifies inwardly from the opposing boundaries in the vertical direction of the irradiation region corresponding to the opening region 353*b*, forming the polysilicon film 14*b*. In this case, the direction of grain boundaries 13 is the lateral direction.

As the laser light irradiation is repeated for the third iteration and the fourth iteration as shown in FIG. 11, the direction of grain boundaries in the channel region is parallel to the longitudinal direction of the channel region (i.e., the direction perpendicular to the scanning direction), and the direction of grain boundaries in the region directly under the drain electrode and the region directly under the source electrode is the direction perpendicular to the longitudinal direction of the channel region (i.e., the scanning direction), as shown in "Fourth iteration" in FIG. 11.

For example, in the opening b, since laser light is simultaneously shot through the two opening regions 352*b* and 352*b*, the amount of laser light irradiation is not varied (even if varied, the variation will be within the tolerable range) between the irradiation regions corresponding to the two opening regions 352*b* and 352*b*. This similarly applies to the two opening regions 353*b* of the opening b. This similarly applies also to the two opening regions 352*c* and 352*c* and the two opening regions 353*c* and 353*c* of the opening c, and to the two opening regions 352d and 352d and the two opening regions 353d and 353d of the opening d.

Thus, it is possible to grow grain boundaries in left-right symmetry with respect to intended central regions (e.g., regions corresponding to the respective central positions of the drain electrode and the source electrode), and the characteristics (e.g., the electron mobility) of the crystallized semiconductor film (the crystalline semiconductor film) can be made uniform in the left-right direction with respect to the central regions. Therefore, it is possible to further prevent the source-drain current value from varying depending on the current flow direction.

As described above, the two opening rows B and C are arranged with the opening row A interposed therebetween. It is possible to crystallize the channel region of the thin film transistor using the opening row A, and crystallize the region of the thin film transistor directly under the drain electrode and the region of the thin film transistor directly under the source electrode using the two opening rows B and C, respectively. In this case, the characteristics (e.g., the electron mobility) can be made uniform between the direction toward the drain electrode and the direction toward the source electrode from the channel region along the longitudinal direction. Also, the characteristics (e.g., the electron mobility) can be made uniform between the direction toward one side of the drain electrode and the direction toward the other opposite side of the drain electrode from the center of the region directly under the drain electrode along the width direction (the direction perpendicular to the longitudinal direction of the channel). The region directly under the source electrode is similar to the region directly under the drain electrode. Thus, it is possible to further prevent the source-drain current value from varying depending on the current flow direction.

In the channel region, since the direction of grain boundaries is the longitudinal direction of the channel region, the degree by which electrons are scattered by grain boundaries is small, and it is possible to realize a large ON current of the thin film transistor. In regions directly under the source electrode and the drain electrode, the direction of grain boundaries is the direction perpendicular to the longitudinal direction of the channel region, for example, and it is therefore possible to increase the frequency with which electrons pass through grain boundaries and reduce the OFF current of the thin film transistor.

Figure 12:
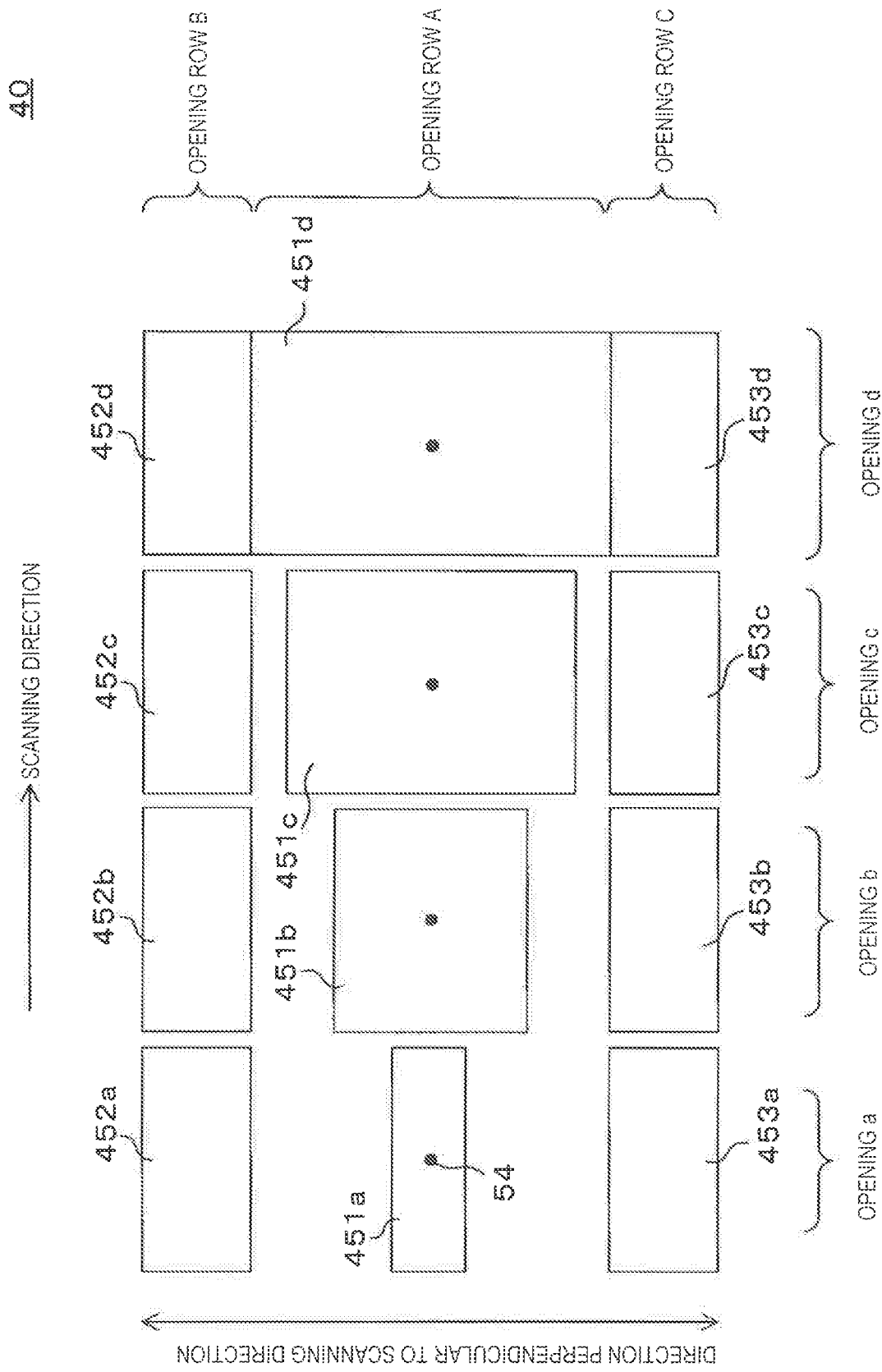
FIG. 12 is a schematic view showing a fifth example of openings of a mask portion of the present embodiment.

FIG. 12 is a schematic view showing a fifth example of openings of the mask portion 40 of the present embodiment. As shown in FIG. 12, opening regions 452a to 452d of the opening row B have an elongate shape of the same size, and have generally the same vertical and lateral dimensions as those of the region directly under the drain electrode. Opening regions 453a to 453d of the opening row C have an elongate shape of the same size, and have generally the same vertical and lateral dimensions as those of the region directly under the source electrode. Note that the opening row A is similar in structure to the opening row A shown in FIG. 5, and will not therefore be further described below.

Figure 13:
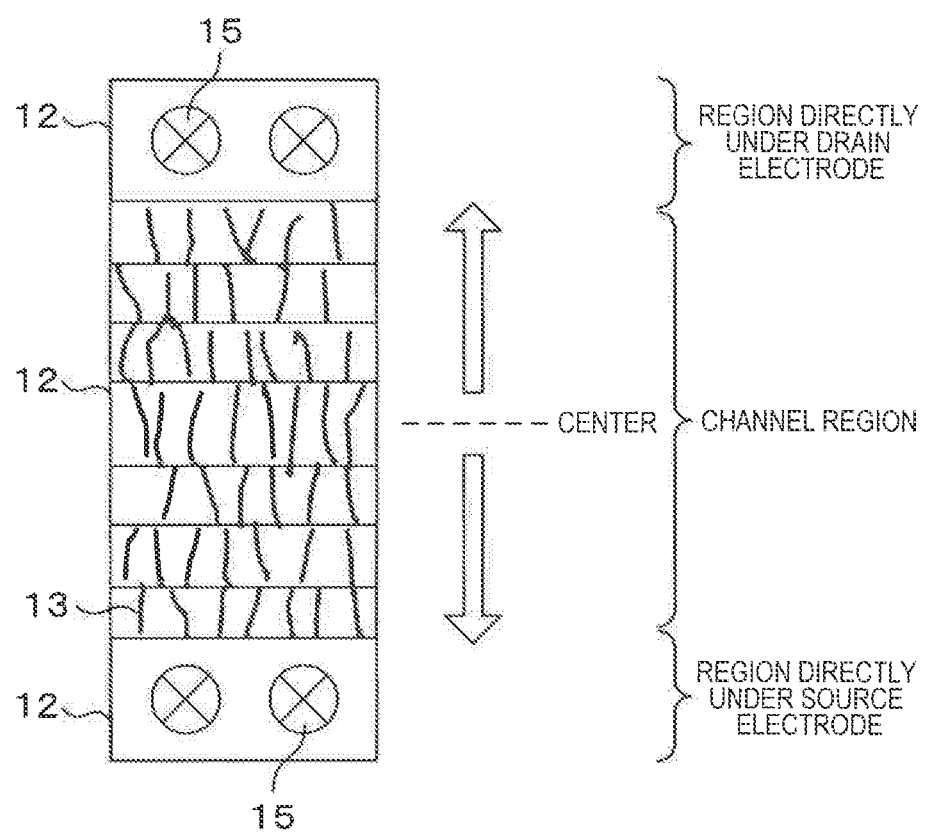
FIG. 13 is a schematic view showing an example of how an amorphous silicon film that is annealed using the mask portion shown in FIG. 12 grows.

FIG. 13 is a schematic view showing an example of how an amorphous silicon film that is annealed using the mask portion 40 shown in FIG. 12 grows. As shown in FIG. 13, since the region directly under the drain electrode and the region directly under the source electrode are irradiated with laser light repeatedly (four times in the example of FIG. 12 for the sake of illustration), there are formed polycrystalline regions where the direction of grain boundaries 15 is the thickness direction (the direction from the near side toward the far side on the drawing sheet, i.e., the direction toward the gate electrode). This is because since the size of the opening regions 452a to 452d is large, the lateral growth does not reach the central portion of the molten region during crystallization, resulting in microcrystals formed in much of the molten region. In the region directly under the drain electrode and the region directly under the source electrode, the direction of grain boundaries is the direction vertical to the drain electrode and the source electrode. Therefore, the degree by which electrons are scattered by grain boundaries is small, and it is possible to increase the ON current of the thin film transistor. Note that how grain boundaries grow in the channel region is similar to FIG. 6, and will not therefore be further described below. This can be realized by appropriately setting the laser light irradiation conditions (the laser light irradiation energy density, the irradiation time and the number of times of irradiation) for each of the openings a to d. That is, the laser light irradiations conditions may vary between the openings a to d.

Figure 14:
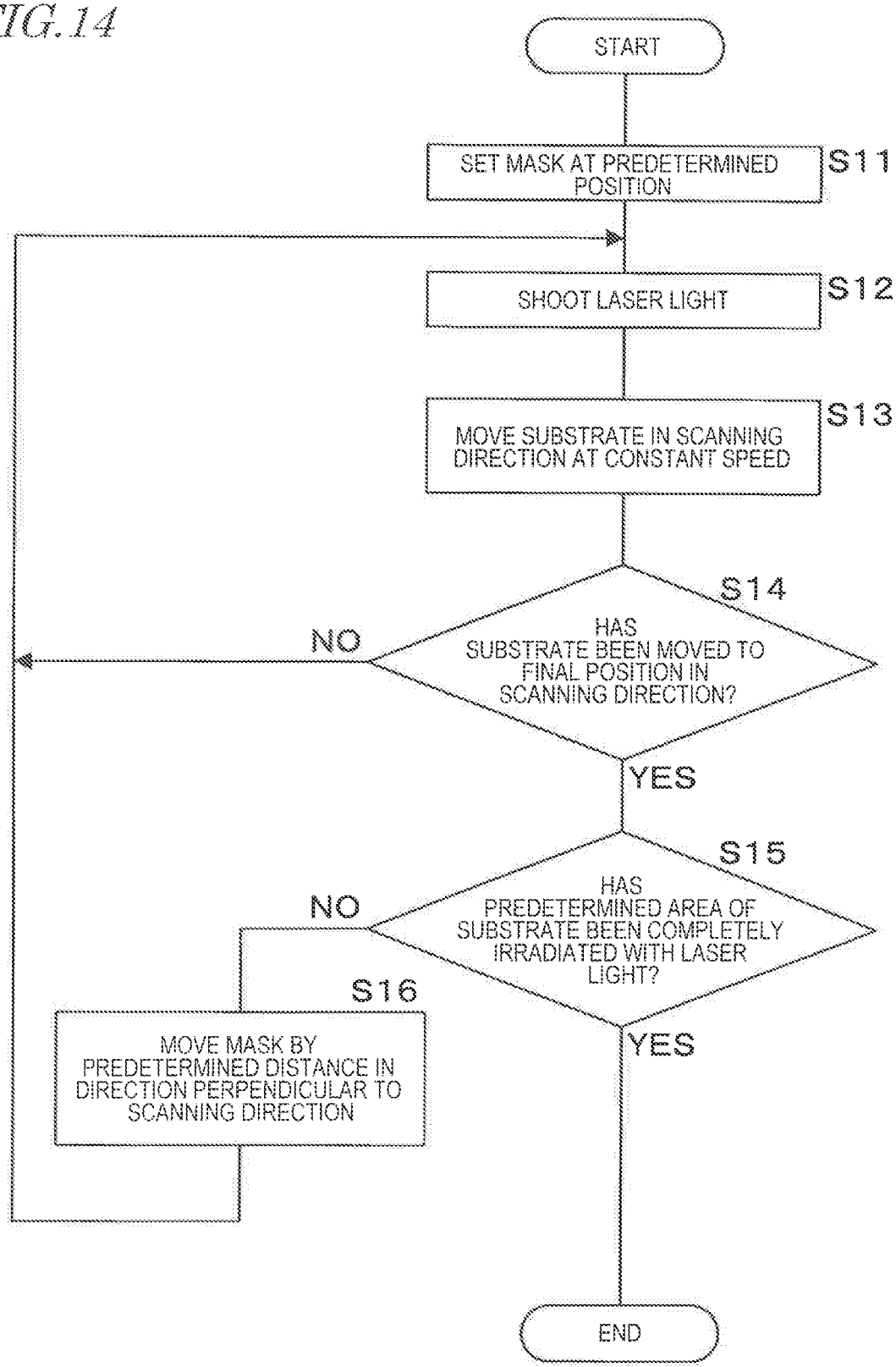
FIG. 14 is a flow chart showing an example of a laser annealing method using the laser annealing apparatus of the present embodiment.

Next, a laser annealing method using the laser annealing apparatus 100 of the present embodiment will be described. FIG. 14 is a flow chart showing an example of a laser annealing method using the laser annealing apparatus 100 of the present embodiment. Hereinafter, the laser annealing apparatus 100 will be referred to as the apparatus 100 for the sake of illustration. The apparatus 100 sets the mask 30 at a predetermined position (S11), and shoots laser light (S12). The apparatus 100 moves the substrate 10 in the scanning direction at a constant speed (S13). The laser light source 70 shoots laser light at time intervals such that laser light is shot each time an irradiation position of the substrate 10 arrives at a position corresponding to an opening 50 of the mask 30.

The apparatus 100 determines whether or not the substrate 10 has been moved to the final position in the scanning direction (S14), and repeats the process of step S12 and subsequent steps if the substrate 10 has not been moved to the final position (NO in S14). If the substrate 10 has been moved to the final position in the scanning direction (YES in S14), the apparatus 100 determines whether or not a predetermined area of the substrate 10 has been completely irradiated with laser light (S15).

If a predetermined area of the substrate 10 has not been completely irradiated with laser light (No in S15), the apparatus 100 moves the mask 30 by a predetermined distance (the dimension L of the mask 30 in the lateral direction) in the direction perpendicular to the scanning direction (S16), and repeats the process of step S12 and subsequent steps. If a predetermined area of the substrate 10 has been completely irradiated with laser light (YES in S15), the apparatus 100 ends the process. Note that the substrate 10 is moved (transferred) in the scanning direction in the example of FIG. 14, but the present invention is not limited thereto. The substrate 10 may be fixed, and the mask 30 (optionally including the optical system 60) may be moved in the scanning direction.

By performing partial laser annealing using the mask 30 of the present embodiment, the crystal grain growth directions (the directions of grain boundaries) in the channel region, the source region and the drain region of the thin film transistor can each be set to an intended direction without additional photolithography and etching steps. Moreover, grain boundaries can be made to grow in symmetry from a predetermined position (e.g., the central position of the channel region, the source region or the drain region), and it is possible to prevent the source-drain current value from varying depending on the current flow direction.

While the shape of each of the opening regions of the openings 50 is a rectangular shape in the embodiment described above, the shape of an opening region is not limited to a rectangular shape but may be an elliptical shape, for example. The four corners of a rectangular opening region may be cut off in a circular or rectangular shape. Then, it is possible to slightly increase the amount of laser light irradiation in the vicinity of the four corners of the opening region, and the region to be irradiated with laser light can be shaped in a rectangular shape.

The present embodiment can be applied not only to TFTs using a silicon semiconductor but also to TFTs using an oxide semiconductor, and it is possible to perform an annealing process wherein the electron mobility is partially varied within one cycle of scan.

A laser annealing apparatus according to the present embodiment is a laser annealing apparatus including a mask having an opening row, wherein the opening row includes openings each including an opening region and arranged in a scanning direction, for irradiating a substrate with laser light through the openings, wherein a first opening including a first opening region and a second opening including a second opening region are arranged next to each other in a direction parallel to the scanning direction, and the mask has a first opening row in which the second opening region includes two opening regions that are obtained by displacing a region corresponding to the first opening region at the second opening in a direction perpendicular to the scanning direction and oppose each other with the region corresponding to the first opening region interposed therebetween.

A laser annealing method according to the present embodiment includes: step A of providing a substrate having an amorphous semiconductor film formed on a surface thereof; and step B of selectively irradiating a portion of the amorphous semiconductor film with laser light, wherein step B includes a step of simultaneously forming, in said portion, two molten regions that have elongate shapes congruent to each other and are arranged in line symmetry with each other.

A mask according to the present embodiment is a mask having an opening row, wherein the opening row includes openings each including an opening region and arranged in a scanning direction, wherein a first opening including a first opening region and a second opening including a second opening region are arranged next to each other in a direction parallel to the scanning direction, and the mask has a first opening row in which the second opening region includes two opening regions that are obtained by displacing a region corresponding to the first opening region at the second opening in a direction perpendicular to the scanning direction and oppose each other with the region corresponding to the first opening region interposed therebetween.

An opening includes one or more opening regions. An opening row includes a plurality of openings arranged in a scanning direction. Where N openings are arranged along one opening row, for example, by shifting a substrate including a semiconductor film formed thereon in the scanning direction, an intended region of the semiconductor film is repeatedly irradiated with laser light N times. The mask may include a plurality of opening rows.

A first opening including a first opening region and a second opening including a second opening region are arranged next to each other in a direction parallel to the scanning direction.

That is, the first opening region a of the first opening and the second opening region b of the second opening are arranged next to each other in the direction parallel to the scanning direction. Where the region corresponding to the first opening region a at the second opening is denoted as the region a', the second opening region b in the first opening row includes, at the second opening, two opening regions that are obtained by displacing the region a' in a direction perpendicular to the scanning direction and oppose each other with the region a' interposed therebetween.

Assume that a semiconductor film is irradiated with laser light through the first opening region a, and grain boundaries grow in a direction perpendicular to the scanning direction in the region irradiated with laser light. At the point in time for the next laser light irradiation, laser light is shot through the second opening region b. In this case, the second opening region b includes two opening regions that are displaced from the region a' in the direction perpendicular to the scanning direction and oppose each other with the region a' interposed therebetween. Since laser is simultaneously shot through the two opening regions, the amount of laser light irradiation is not varied between the irradiation regions corresponding to the two opening regions. In the irradiation regions of the semiconductor film corresponding to the two opening regions of the second opening region b, grain boundaries grow from the region a' in directions that are perpendicular to the scanning direction and that are different from each other by 180°, for example. Where the direction parallel to the scanning direction is denoted as the left-right direction and the direction perpendicular to the scanning direction as the up-down direction, grain boundaries grow from the region a' in the up-down direction.

Thus, grain boundaries can be made to grow in up-down symmetry with respect to an intended central region, and the characteristics (e.g., the electron mobility) of the crystallized semiconductor film (the crystalline semiconductor film) can be made uniform in the up-down direction with respect to the central region. Therefore, it is possible to prevent the source-drain current value from varying depending on the current flow direction.

In a laser annealing apparatus according to the present embodiment, the second opening region does not include a portion of a region corresponding to the first opening region at the second opening.

The second opening region b does not include a portion of the region a' corresponding to the first opening region a at the second opening. Thus, where laser light is shot through the second opening, a crystalline semiconductor film corresponding to the region a' can be prevented from being irradiated with laser light, and it is possible to easily realize intended characteristics of the crystalline semiconductor film.

In a laser annealing apparatus according to the present embodiment, the second opening region includes a region corresponding to the first opening region at the second opening.

The second opening region b includes the region a' corresponding to the first opening region a at the second opening. Thus, where laser light is shot through the second opening, a crystalline semiconductor film corresponding to the region a' can also be irradiated with laser light, and it is possible to easily realize intended characteristics of the crystalline semiconductor film.

In a laser annealing apparatus according to the present embodiment, the mask has a second opening row in which the second opening region includes two opening regions that are obtained by displacing a region corresponding to the first opening region at the second opening in a direction parallel to the scanning direction and oppose each other with said region interposed therebetween.

The opening region a of the first opening and the second opening region b of the second opening are arranged next to each other in a direction parallel to the scanning direction. Where the region corresponding to the first opening region a at the second opening is denoted as the region a', the second opening region b in the second opening row includes, at the second opening, two opening regions that are obtained by displacing the region a' in a direction parallel to the scanning direction and oppose each other with the region a' interposed therebetween.

Assume that a semiconductor film is irradiated with laser light through the first opening region a, and grain boundaries grow in the direction parallel to the scanning direction in the region irradiated with laser light. At the point in time for the next laser light irradiation, laser light is shot through the second opening region b. In this case, the second opening region b includes two opening regions that are displaced from the region a' in a direction parallel to the scanning direction and oppose each other with the region a' interposed therebetween. Since laser is simultaneously shot through the two opening regions, the amount of laser light irradiation is not varied between the irradiation regions corresponding to the two opening regions. In the irradiation regions of the semiconductor film corresponding to the two opening regions of the second opening region b, grain boundaries grow from the region a' in directions that are parallel to the scanning direction and that are different from each other by 180°, for example. Where the direction parallel to the scanning direction is denoted as the left-right direction and the direction perpendicular to the scanning direction as the up-down direction, grain boundaries grow from the region a' in the left-right direction.

Thus, grain boundaries can be made to grow in left-right symmetry with respect to an intended central region, and the characteristics (e.g., the electron mobility) of the crystallized semiconductor film (the crystalline semiconductor film) can be made uniform in the left-right direction with respect to the central region. Therefore, it is possible to prevent the source-drain current value from varying depending on the current flow direction. Moreover, it is possible to produce a structure having different grain boundaries on the same substrate. For example, grain boundaries can be made to grow in different directions.

In a laser annealing apparatus according to the present embodiment, two of the second opening rows are arranged with the first opening row interposed therebetween.

The two second opening rows are arranged with the first opening row interposed therebetween. It is possible to crystallize the channel region of the thin film transistor using the first opening row, and crystallize the region directly under the drain electrode and the region directly under the source electrode of the thin film transistor using the two second opening rows. In this case, the characteristics (e.g., the electron mobility) can be made uniform between the direction toward the drain electrode and the direction toward the source electrode from the channel region along the longitudinal direction. Also, the characteristics (e.g., the electron mobility; can be made uniform between the direction toward one side of the drain electrode and the direction toward the other opposite side of the drain electrode from the center of the region directly under the drain electrode along the width direction (the direction perpendicular to the longitudinal direction of the channel). The region directly under the source electrode is similar to the region directly under the drain electrode. Thus, it is possible to prevent the source-drain current value from varying depending on the current flow direction.

In a laser annealing apparatus according to the present embodiment, the two opening regions have generally the same size.

The two opening regions have generally the same size. Thus, the irradiation regions, which are in symmetry with respect to the central region and have generally the same thin film transistor characteristics, can be made to have generally the same size.

In a laser annealing apparatus according to the present embodiment, the first opening region and the second opening region each form a rectangular shape.

The first opening region a and the second opening region b each form a rectangular shape. For example, in the first opening row, the first opening region a and the second opening region b may have shapes elongated in the direction parallel to the scanning direction, and in the second opening row, the first opening region a and the second opening region b may have shapes elongated in the direction perpendicular to the scanning direction. Thus, the direction of grain boundaries can be an intended direction.

A thin film transistor according to the present embodiment has an active layer that is annealed by the laser annealing apparatus according to the present embodiment.

It is possible to realize a thin film transistor with which it is possible to prevent the source-drain current value from varying depending on the current flow direction.

The elements described in the examples above can be combined with each other, and any such combination may bring forth a new technical feature.

The present application claims priority of Japanese Patent Application No. 2018-143166, filed on Jul. 31, 2018, the entire contents of which are hereby incorporated by reference.

What is claimed is:

1. A laser annealing method comprising:
preparing a substrate having an amorphous semiconductor film formed on a surface thereof; and
forming a plurality of polycrystalline regions by irradiating the amorphous semiconductor film with laser light a plurality of times through a mask having a plurality of openings, an irradiation energy density of the laser light and a time duration and number of times of the irradiating being set so that the amorphous semiconductor film is not heated to or above a melting point of polycrystalline, while moving the substrate relative to the mask so as to partially melt-crystallize the amorphous semiconductor film,
wherein the plurality of polycrystalline regions include a first polycrystalline region that has a shape elongated in a first direction with an aspect ratio of three or more and symmetrical with respect to a first center line parallel to the first direction, and two second polycrystalline regions that are adjacent to the first polycrystalline region in a direction perpendicular to the first direction, that have congruent shapes to each other, and that are arranged symmetrically with respect to the first center line, and
the forming includes simultaneously forming two molten regions to be the two second polycrystalline regions.

2. The laser annealing method of claim 1, wherein the forming includes, after forming the first polycrystalline region, irradiating a region of the amorphous semiconductor film including the first polycrystalline region with the laser light so as to simultaneously form the two molten regions to be the two second polycrystalline regions.

3. The laser annealing method of claim 1, wherein the forming includes, after forming the first polycrystalline region, irradiating two regions of the amorphous semiconductor film, each of which partially overlaps the first polycrystalline region and that are arranged symmetrically with respect to the first center line, with the laser light so as to simultaneously form the two molten regions to be the two second polycrystalline regions.

4. The laser annealing method of claim 1, wherein the forming includes, after forming the two second polycrystalline regions, a step of irradiating a region of the amorphous semiconductor film, which partially includes both of the two second polycrystalline regions, with the laser light as to form a first molten region to be the first polycrystalline region that is adjacent to the two second polycrystalline regions.

5. The laser annealing method of claim 1, wherein the plurality of polycrystalline regions include a third polycrystalline region that has a shape elongated in a second direction perpendicular to the first direction and symmetrical with respect to a second center line parallel to the second direction, and two fourth polycrystalline regions that are adjacent to the third polycrystalline region, the two fourth polycrystalline regions having congruent shapes to each other, and the two fourth polycrystalline regions being arranged symmetrically with respect to the second center line, and
wherein the forming includes simultaneously forming two fourth molten regions to be the two fourth polycrystalline regions.

6. The laser annealing method of claim 1, wherein the plurality of polycrystalline regions include a third polycrystalline region that has a shape elongated in the first direction and symmetrical with respect to the first center line, and that is spaced from the first polycrystalline region, and
the forming includes irradiating a molten region to be the third polycrystalline region with the laser light a plurality of times.

7. The laser annealing method of claim 1, wherein the substrate is moved relative to the mask in the first direction.

* * * * *